(12) United States Patent
Smith

(10) Patent No.: US 8,975,545 B2
(45) Date of Patent: Mar. 10, 2015

(54) CIRCUIT INTERRUPTER INCLUDING INDICATOR CIRCUIT

(75) Inventor: Ryan A. Smith, Monaca, PA (US)

(73) Assignee: Eaton Corporation, Cleveland, OH (US)

( * ) Notice: Subject to any disclaimer, the term of this patent is extended or adjusted under 35 U.S.C. 154(b) by 291 days.

(21) Appl. No.: 13/477,497

(22) Filed: May 22, 2012

(65) Prior Publication Data

US 2013/0313088 A1 Nov. 28, 2013

(51) Int. Cl.
| | |
|---|---|
| *H01H 9/00* | (2006.01) |
| *H01H 9/16* | (2006.01) |
| *G01R 31/04* | (2006.01) |
| *H01H 9/18* | (2006.01) |
| *H01H 71/00* | (2006.01) |

(52) U.S. Cl.
CPC ............ *H01H 9/167* (2013.01); *G01R 31/041* (2013.01); *H01H 9/182* (2013.01); *H01H 71/00* (2013.01); *H01H 2300/03* (2013.01)
USPC ........................................................ 200/310

(58) Field of Classification Search
USPC ........... 200/310, 49, 56 R, 308, 19.22, 19.26, 200/19.27, 19.3, 43.01; 361/93; 335/17; 340/638, 642
See application file for complete search history.

(56) References Cited

U.S. PATENT DOCUMENTS

| | | | | |
|---|---|---|---|---|
| 4,907,003 | A | * | 3/1990 | Marshall et al. .............. 342/352 |
| 5,239,205 | A | * | 8/1993 | Hoffman et al. .............. 307/117 |
| 8,643,501 | B2 | * | 2/2014 | Sisley et al. .................. 340/638 |

* cited by examiner

*Primary Examiner* — Edwin A. Leon
*Assistant Examiner* — Anthony R. Jimenez
(74) *Attorney, Agent, or Firm* — Eckert Seamans Cherin & Mellott, LLC; Kirk D. Houser; Nathaniel C. Wilks

(57) ABSTRACT

A circuit interrupter includes an enclosure; a first terminal; a second terminal; separable contacts electrically connected between the first and second terminals; an operating mechanism structured to open and close the separable contacts; and an indicator circuit electrically interconnected with the second terminal The indicator circuit is structured to indicate occurrence of a signal at the second terminal. The signal has a frequency substantially greater than a power line frequency.

17 Claims, 3 Drawing Sheets

CIRCUIT INTERRUPTER INCLUDING INDICATOR CIRCUIT

CROSS-REFERENCE TO RELATED APPLICATION

This application is related to commonly assigned, copending U.S. patent application Ser. No. 13/477,493, filed May 22, 2012, entitled "Apparatus For A Circuit Interrupter".

BACKGROUND

1. Field

The disclosed concept pertains generally to power circuits and, more particularly, to power circuits protected by circuit interrupters. The disclosed concept further pertains to apparatus for installing, testing, operating and/or maintaining such power circuits and/or circuit interrupters.

2. Background Information

A conventional circuit breaker panel inputs, for example and without limitation, a conventional 120 $VAC_{RMS}$, 60 Hz power line as distributed by a power company. This input is received by an electrical conductor, which is electrically connected to a hot buss bar. A line terminal of a main circuit breaker is electrically connected to the hot buss bar and a load terminal of the main circuit breaker is electrically connected to line terminals of a plurality of branch circuit breakers. Each branch circuit breaker protects a branch power circuit that is electrically connected to the load terminal of the corresponding branch circuit breaker. A neutral is used to complete the electrical power circuit of, for example, an electrical outlet or receptacle, and is electrically connected to a neutral buss bar in the circuit breaker panel. A ground is used as a safety precaution to protect against ground fault currents in the power circuit and is electrically connected to a ground buss bar in the circuit breaker panel.

A common problem in a building's electrical system is mislabeled or unmapped circuit breakers and outlets. While installing an electrical system in a building, power circuits can become confused and/or mislabeled. Because electricians can never be exactly sure which power circuit is electrically connected to an outlet, and, more importantly, which circuit breaker is electrically connected to the outlet, they continuously have to double check electrical connections. This could mean numerous trips between a circuit breaker panel room and the remote location of an outlet. This problem increases in a relatively large warehouse or commercial building.

One proposed solution for this problem uses two electricians, one at the remote location of the power circuit (e.g., an outlet) and the other in an electrical room where a circuit breaker panel is located, communicating with each other whether the power circuit in question is energized. For example, often equipped with hand held radios, one electrician turns off a circuit breaker at the circuit breaker panel, while the other electrician tests for voltage on the electrical outlet and relays back whether the power circuit is off or still energized. With some electrical panels having, for example, more than forty circuit breakers, this proposal can be time consuming and potentially hazardous.

Most circuit breakers, as employed in circuit breaker panels, do not incorporate any type of luminous indication of status (e.g., on; off; tripped). When looking at a circuit breaker panel with, for example, more than forty circuit breakers, it is difficult to distinguish between a circuit breaker that is on, one that is off and one that is tripped.

According to the Bureau of Labor Statistics, in 2007, there were 43,500 recorded non-fatal injuries in the electrical contracting industry. Among these statistics are a number of incidents that are a direct result of improper or non-thorough circuit detection procedures that cause unknown energized power circuits.

There is a need for an apparatus that can minimize time, effort and hazards associated with locating power circuits and circuit interrupters.

There is room for improvement in circuit interrupters operatively associated with such power circuits.

SUMMARY

These needs and others are met by embodiments of the disclosed concept in which a circuit interrupter indicator circuit is electrically interconnected with a terminal (e.g., without limitation, a load terminal) and is structured to indicate occurrence of a signal at the terminal, wherein the signal has a frequency substantially greater than a power line frequency.

In accordance with one aspect of the disclosed concept, a circuit interrupter comprises: an enclosure; a first terminal; a second terminal; separable contacts electrically connected between the first and second terminals; an operating mechanism structured to open and close the separable contacts; and an indicator circuit electrically interconnected with the second terminal and being structured to indicate occurrence of a signal at the second terminal, wherein the signal has a frequency substantially greater than a power line frequency.

The indicator circuit may comprise an inductor electrically connected between the separable contacts and one of the first terminal and the second terminal, an indicator device, and a capacitor electrically connected between the second terminal and the indicator device; the inductor may be structured to pass the power line frequency and block the frequency of the signal; and the capacitor may be structured to block the power line frequency and pass the frequency of the signal to the indicator device.

The enclosure may comprise a mechanical connection point structured to retain the circuit interrupter in a circuit interrupter panel with a number of other circuit interrupters; and the mechanical connection point may provide a ground connection to the indicator circuit.

As another aspect of the disclosed concept, a circuit interrupter comprises: a first terminal; a second terminal; separable contacts electrically connected between the first and second terminals; an operating mechanism structured to open and close the separable contacts; and an indicator circuit electrically interconnected with the second terminal and being structured to indicate occurrence of a signal at the second terminal, wherein the signal has a frequency substantially greater than a power line frequency.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The disclosed concept will be described as applied to a miniature circuit breaker for use in alternating current (AC) systems, which are typically 60 Hz, but can also be used in direct current (DC) systems. It will also become evident that the disclosed concept is applicable to other types of circuit interrupters including those used in AC systems operating at other frequencies; to relatively smaller circuit breakers, such as subminiature, aircraft or aerospace circuit breakers; to relatively larger circuit breakers, such as commercial circuit breakers; and to a wide range of circuit interrupter applications, such as, for example and without limitation, residential, commercial, industrial, aerospace, and automotive. As further non-limiting examples, both AC (e.g., 110, 120, 208, 220, 240 or 480-600 $VAC_{RMS}$) operation at a wide range of frequencies (e.g., 50, 60, 120 or 400 Hz) and DC operation (e.g., 42 VDC) are possible.

The disclosed concept employs a circuit interrupter and an apparatus including a transmitter that assist, for example and without limitation, electricians in recognizing an electrical connection between a power circuit, such as an electrical outlet or receptacle thereof, and a corresponding circuit interrupter, and properly detecting the power circuit. For example and without limitation, the apparatus can plug into the electrical outlet or receptacle and transmit a suitable signal back through power circuit conductors of the power circuit to the corresponding circuit interrupter. The circuit interrupter includes an indicator circuit structured to indicate when the transmitted signal is received by the circuit interrupter. The apparatus can include an optional function to allow the user to trip the circuit interrupter directly from the power circuit.

It is believed that there is no known device that can safely and reliably trip a circuit interrupter by plugging such device into an electrical outlet or receptacle, as opposed to walking to a circuit breaker panel and manually turning the circuit interrupter off. Although a shorting wire could hypothetically be inserted into an electrical outlet or receptacle to trip a circuit interrupter, that approach is quite unsafe and must, therefore, not be used.

The combination of a circuit interrupter having a suitable indicator circuit and an apparatus that can remotely interact with the circuit interrupter from, for example and without limitation, a remote electrical outlet or receptacle, can solve the problem of identifying power circuits.

Figure 1:
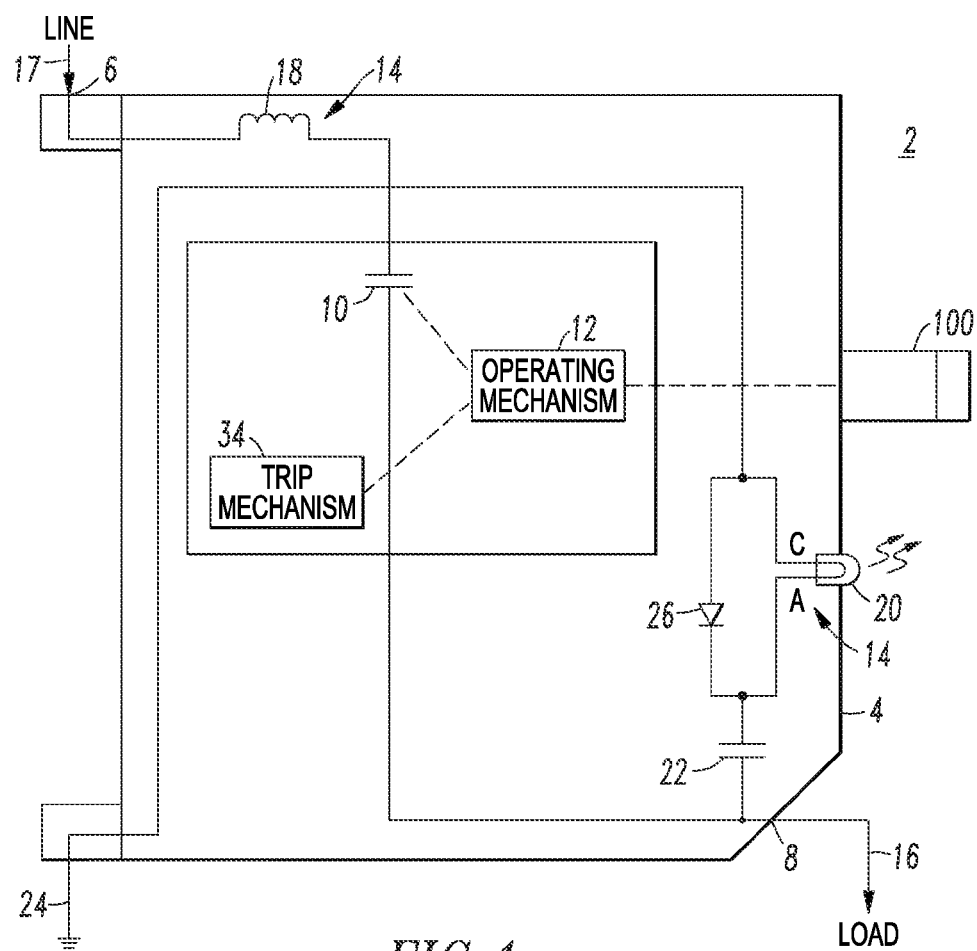
FIG. 1 is a block diagram of a circuit interrupter in accordance with embodiments of the disclosed concept.

Referring to FIG. 1, a circuit interrupter 2 includes an enclosure 4, a first terminal 6, a second terminal 8, separable contacts 10 electrically connected between the first and second terminals 6,8, an operating mechanism 12 structured to open and close the separable contacts 10, and an indicator circuit 14 electrically interconnected with the second terminal 8 and being structured to indicate occurrence of a signal 16 at the second terminal 8. The signal 16 has a frequency substantially greater than a power line frequency 17 (e.g., at the first terminal 6).

EXAMPLE 1

The power line frequency 17 is less than or equal to about 400 Hz (e.g., without limitation, 50 Hz; 60 Hz; 120 Hz; 400 Hz).

EXAMPLE 2

The frequency of the signal 16 is about 8 MHz. Alternatively, the frequency of the signal 16 may range from about 7 MHz to about 9 MHz.

EXAMPLE 3

The example indicator circuit 14 includes an inductor 18 (e.g., without limitation, 27 µH) electrically connected between the separable contacts 10 and one of the first terminal 6 and the second terminal 8, an indicator device (e.g., without limitation, a light emitting diode (LED) 20), and a capacitor 22 (e.g., without limitation, 0.1 nF) electrically connected between the second terminal 8 and the LED 20. The inductor 18 passes the power line frequency 17 and blocks the frequency of the signal 16. The capacitor 22 blocks the power line frequency 17 and passes the frequency of the signal 16 to the LED 20.

Figure 3:
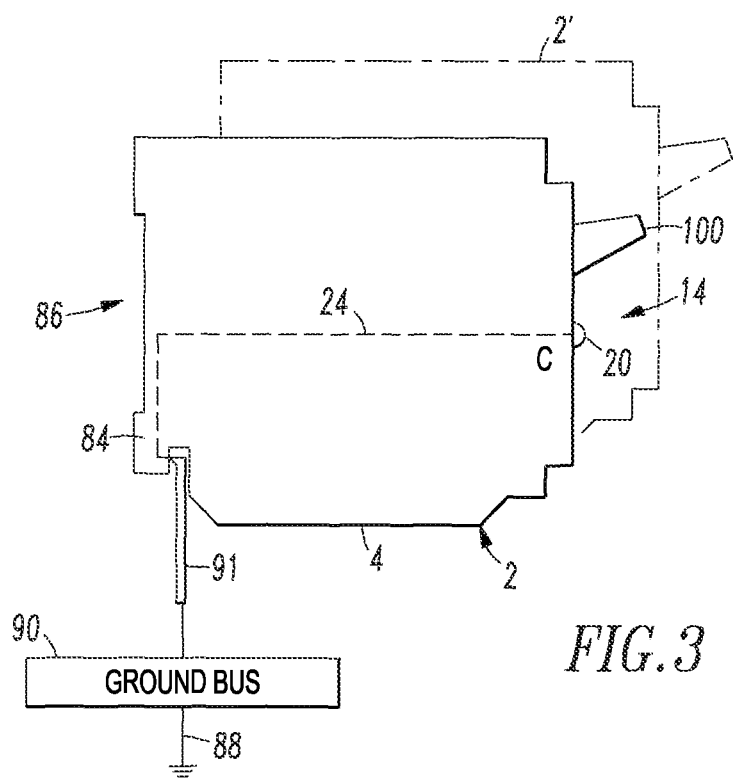
FIG. 3 is a block diagram of two panel mounted circuit interrupters in accordance with another embodiment of the disclosed concept.

The indicator circuit 14 also includes a ground connection 24 that is structured to be electrically connected to, for example and without limitation, a grounded circuit interrupter panel 86 (FIG. 3). The indicator circuit 14 further includes a diode 26. The capacitor 22 is electrically connected between the second terminal 8 and the anode (A) of the LED 20, the cathode of the diode 26 is electrically connected to the anode of the LED 20, the anode of the diode 26 is electrically connected to the cathode (C) of the LED 20, and the cathode of the LED 20 is grounded by the ground connection 24. The capacitor 22 passes the frequency of the signal 16 to the anode of the LED 20, in order to illuminate the LED 20, and blocks the power line frequency 17 from the anode of the LED 20. The diode 26 passes negative half cycles of the frequency of the signal 16.

The indicator circuit 14 inputs the example high frequency signal 16 from an apparatus transmitter 30 (FIG. 2) and responsively outputs light from the illuminated LED 20, which is on when the apparatus transmitter 30 transmits the example 8 MHz signal 16 and, otherwise, is off. The capacitor 22 functions as an open circuit to the line frequency 17 and a short to the 8 MHz signal 16. The diode 26 provides a path for the negative half cycle of the 8 MHz signal 16 and for the capacitor 22 to discharge.

EXAMPLE 4

A current flowing between the first and second terminals 6,8 is less than or equal to about 20 $A_{RMS}$ when the separable contacts 10 are closed.

EXAMPLE 5

The indicator circuit 14 includes a suitable indicator device, such as the example LED 20, structured to indicate the occurrence of the signal 16 at the second terminal 8 when the separable contacts 10 are opened or closed.

EXAMPLE 6

A simple and suitable way to implement the circuit interrupter 2 includes adding a suitable indicator circuit 14 including the example LED 20 and a suitable filter, such as including a number of inductors 18 and capacitors 22 (only one inductor 18 and one capacitor 22 are shown in FIG. 1). Since the line frequency 17, such as 60 Hz, at an electrical outlet or receptacle, and the example 8 MHz frequency of the signal 16 are significantly different, these frequencies can be separated from each other without affecting the operation of a corresponding power circuit, such as 28 of FIG. 2.

Figure 2:
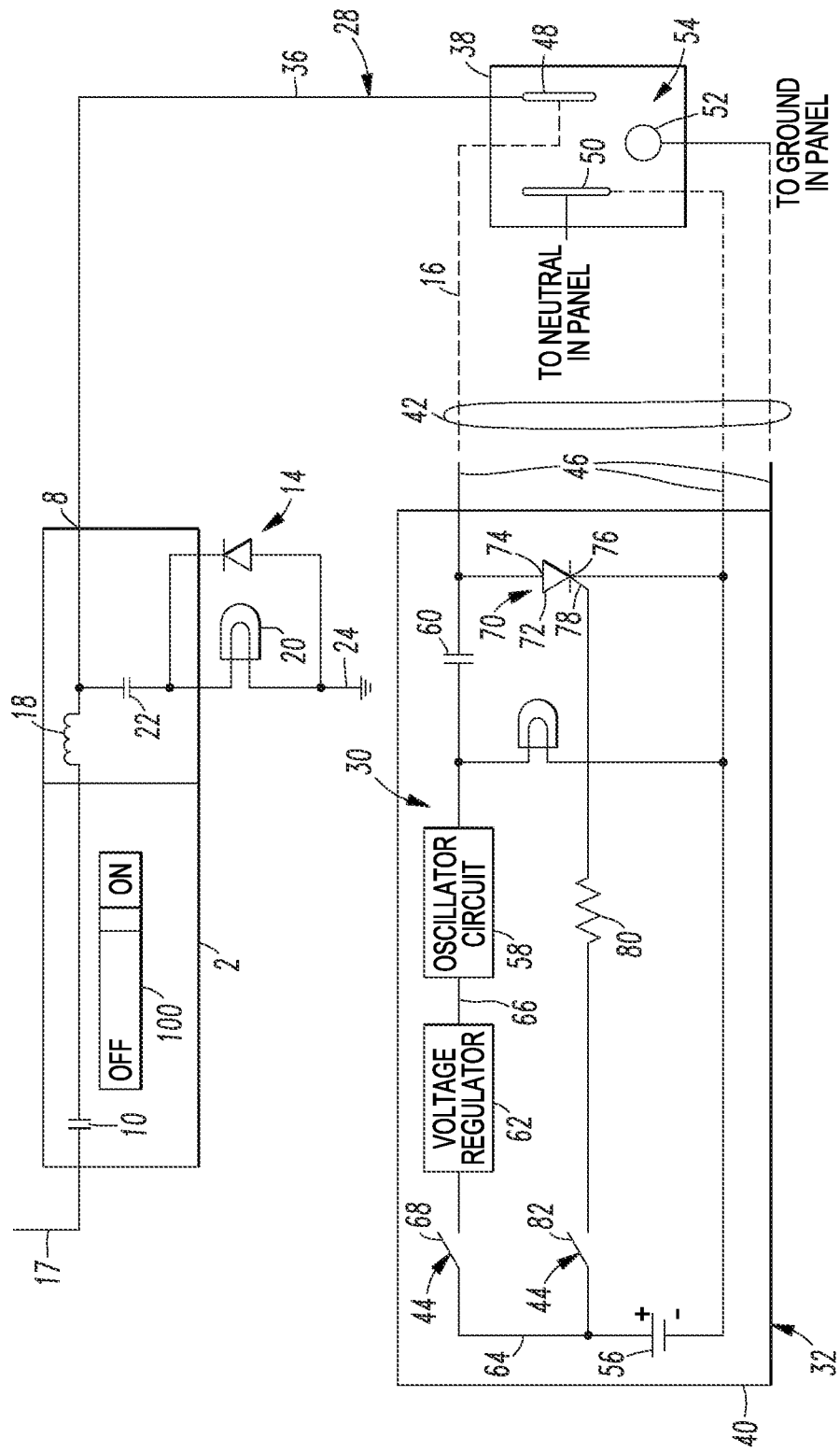
FIG. 2 is a block diagram of a circuit interrupter, power circuit, outlet and a portable apparatus in accordance with other embodiments of the disclosed concept.

The circuit interrupter 2 (e.g., without limitation, a circuit breaker) protects the power circuit 28 as shown in FIG. 2. The example LED 20 of the indicator circuit 14 is illuminated when a suitable signal 16 (e.g., without limitation, 8 MHz) is transmitted from the transmitter 30 of an apparatus 32 as shown in FIG. 2. The inductor 18 (which may be disposed at the load side of the separable contacts 10 as shown in FIG. 2) passes the line frequency 17 (e.g., without limitation, 60 Hz) coming from the circuit interrupter 2 and blocks the example 8 MHz signal 16 transmitted by the apparatus transmitter 30. This blocks the 8 MHz signal 16 from passing through the circuit interrupter 2 and reaching other circuit breakers (not shown, but see circuit interrupter 2' of FIG. 3) and their LEDs (not shown) of a circuit breaker panel (not shown, but see circuit interrupter panel 86 of FIG. 3) via a hot buss bar (not shown) thereof. Also, the capacitor 22 acts as an open circuit to relatively low frequencies and blocks the line frequency 17, in order to prevent the line frequency 17 from reaching and illuminating the LED 20, while acting as a short to relatively high frequencies and passing the 8 MHz signal 16 to illuminate the LED 20. The example LED 20 is illuminated when the apparatus 32 is installed and activated by a user, as will be described. This enables the user to detect which circuit breaker protects a specific electrical outlet or receptacle in a room or building.

The circuit interrupter 2 receives the example 8 MHz signal 16 from its load terminal 8 as transmitted by the apparatus 32. The example circuit breaker LED 20 is illuminated when the apparatus 32 transmits the example 8 MHz signal 16, regardless whether the circuit interrupter 2 is on, off or tripped. The example 8 MHz signal 16 is choked out by the inductor 18, in order that it does not pass to other circuit breakers (not shown) via the hot buss bar (not shown) of a circuit breaker panel (not shown). Otherwise, the circuit interrupter separable contacts 10, operating mechanism 12 (FIG. 1) and trip mechanism 34 (FIG. 1) are conventional. Since the LED 20 is only illuminated by the 8 MHz signal 16, the LED 20 illuminates when the circuit interrupter 2 is in any position (e.g., on; off; tripped). Because the LED 20 and other components of the indicator circuit 14 are after the separable contacts 10 of the circuit interrupter 2, the LED 20 still receives the 8 MHz signal 16 from the apparatus 32 over a load conductor 36, which electrically connects the circuit interrupter 2 to an electrical outlet or receptacle 38.

FIG. 2 shows the circuit interrupter 2, the power circuit 28, the electrical outlet or receptacle 38, and the apparatus 32. The apparatus 32 includes an enclosure 40, a connector 42 structured to mechanically and electrically engage the power circuit 28, the transmitter 30 structured to transmit the signal 16 having a frequency substantially greater than the power line frequency 17 to the connector 42, and a user interface 44 structured to cause the transmitter 30 to transmit the signal 16 to the connector 42.

EXAMPLE 7

The connector 42 mechanically and electrically engages the power circuit 28 at the electrical outlet or receptacle 38. The connector 42 forms part of a male three prong plug 46 that mechanically and electrically engages a hot contact 48, a neutral contact 50 and a ground contact 52 of a female socket 54 of the electrical outlet or receptacle 38. The ground contact 52 is electrically connected to the apparatus enclosure 40.

EXAMPLE 8

The transmitter 30 includes a battery 56 and an oscillator circuit 58 (e.g., without limitation, an 8 MHz crystal oscillator). The user interface 44 can energize the oscillator circuit 58 from the battery 56. When energized, the oscillator circuit 58 transmits the signal 16 having the example 8 MHz frequency to the connector 42. The transmitter 30 further includes a capacitor 60 (e.g., without limitation, 0.1 nF) electrically connected between the oscillator circuit 58 and the connector 42, and a voltage regulator 62 that inputs a first direct current voltage 64 (e.g., without limitation 9 VDC) from the battery 56 and outputs a second direct current regulated voltage 66 (e.g., without limitation 5 VDC) to power the oscillator circuit 58. The battery 56 permits the signal 16 to be transmitted regardless whether the power circuit 28 is energized by a line voltage having the power line frequency 17.

The user interface 44 includes a switch 68 that when closed causes the oscillator circuit 58 to transmit the signal 16. The oscillator circuit 58 inputs the regulated voltage 66 and transmits the signal 16 when the user turns on the apparatus 32 and plugs it into the electrical outlet or receptacle 38. The capacitor 60 passes the signal 16 from the oscillator circuit 58 to the connector 42 and blocks the power line frequency 17 from the connector 42 to the oscillator circuit 58. The transmitter 30 outputs the signal 16 to the power circuit 28 when the connector 42 mechanically and electrically engages the electrical outlet or receptacle 38 of the power circuit 28 and the user interface 44 causes the transmitter 30 to transmit the signal 16 to the connector 42 and, in turn, to the hot contact 48 of the female socket 54 of the electrical outlet or receptacle 38. The high frequency signal 16 is then received from the power circuit 28 by the indicator circuit 14, which illuminates the LED 20 of the corresponding circuit interrupter, such as 2.

EXAMPLE 9

The example 8 MHz signal 16 has a relatively low power level (e.g., without limitation, less than about 4.5 mA and less than about 3 V) to avoid causing any significant interference with other apparatus (not shown) commonly employed in or with a building, power distribution system or power circuit, and is subject to relatively little attenuation when transmitted over power circuit conductors, such as 36. The example 8 MHz signal 16 has a sufficient power level to compensate for power circuit conductor losses and attenuation, in order to illuminate the LED 20 of the circuit interrupter 2, but has an insufficient power level to illuminate other LEDs (not shown) of other circuit interrupters (not shown) in a circuit breaker panel (not shown) in the unlikely event that the 8 MHz signal 16 is leaked by the inductor 18.

EXAMPLE 10

For added security and convenience, an optional shorting circuit 70 having a suitable switch, such as a silicon controlled rectifier (SCR) 72, can optionally be included with the transmitter 30 of the apparatus 32 to trip the circuit interrupter 2 from the corresponding electrical outlet or receptacle 38. The user interface 44 may include the optional shorting circuit 70 to short the power circuit 28. The shorting circuit 70 includes the SCR 72 structured to short the hot line at hot contact 48 to the neutral at neutral contact 50 of the power circuit 28. The SCR 72 has an anode 74 electrically connected to the hot line, a cathode 76 electrically connected to the neutral, and a gate 78. The SCR gate 78 is energized through resistor 80 (e.g., without limitation, 450 Ω) by the battery 56 responsive to closure of a switch 82, which causes the SCR 72 to short the hot line to the neutral. This causes an over-current fault, which causes a trip of the corresponding circuit interrupter, such as 2.

EXAMPLE 11

The disclosed apparatus 32 is relatively compact and can be enclosed in the suitably rigid enclosure 40 (e.g., without limitation, a plastic housing), which encloses the transmitter 30 and the optional shorting circuit 70.

EXAMPLE 12

If a user is trying to determine which circuit interrupter, such as 2, corresponds to the electrical outlet or receptacle 38, then they can enable the signal 16 from the apparatus 32 and walk to the circuit breaker panel (not shown) to see, for example, which circuit interrupter has illuminated the LED 20. This can either be done when the power circuit 28 is live or on, or when off or tripped.

EXAMPLE 13

If a user would like to work on the electrical outlet or receptacle 38 and doesn't care about the corresponding circuit interrupter, such as 2, then the user can enable the SCR 72, which trips the corresponding circuit interrupter 2, electrically check to confirm that the power circuit 28 is dead (e.g., off; tripped), and then work on the electrical outlet or receptacle 38 or power circuit 28 without having to go to the circuit breaker panel (not shown) to check if the corresponding circuit interrupter, such as 2, is tripped or whether the LED 20 is illuminated. The SCR 72 essentially creates a short at the electrical outlet or receptacle 38, which trips the corresponding circuit interrupter, such as 2, thereby eliminating the need for a user to go to the circuit breaker panel (not shown) and turn off the corresponding circuit interrupter, such as 2.

EXAMPLE 14

The example radio frequency (RF) signal 16 (e.g., having a frequency substantially greater than a line frequency, such as 17) of about 8 MHz is believed to be preferred for the apparatus transmitter 30.

EXAMPLE 15

After the apparatus 32 is plugged into the electrical outlet or receptacle 38, the user enables the apparatus transmitter 30, which transmits the example 8 MHz signal 16. The 8 MHz signal 16 passes through the electrical outlet or receptacle 38 and then through the conductors, such as 36, of the power circuit 28. The 8 MHz signal 16 then enters the indicator circuit 14 of the corresponding circuit interrupter, such as 2, which turns on and illuminates the LED 20.

EXAMPLE 16

FIG. 3 shows a simplified view of the circuit interrupter 2 including the indicator circuit 14 and a mechanical connection point 84 suitable for providing a ground 88 to the indicator circuit 14. The mechanical connection point 84 of the circuit interrupter enclosure 4 retains the circuit interrupter 2 in a circuit interrupter panel 86 with a number of other circuit interrupters, such as 2', and provides the ground 88 to the indicator circuit 14.

The example mechanical connection point 84 is where the circuit interrupter 2 mechanically fastens to the circuit breaker panel 86, which provides a suitable source for a ground 88. This connection point 84 is electrically connected to a ground bus 90 in the circuit breaker panel 86. The panel connection point 91 is, for example and without limitation, a conductive bar (e.g., a mechanical connection point) that the circuit interrupter 2 mechanically fastens to in the circuit breaker panel 86. The conductive bar 91 is electrically connected to the ground bus 90 in the circuit breaker panel 86. The ground 88 provides the ground connection 24 (also shown in FIGS. 1 and 2) for the indicator circuit 14. The LED 20 of the indicator circuit 14, in turn, employs the ground connection 24. For most circuit breakers (e.g., without limitation, for power circuits rated at 20 A or less), there is no ground in the circuit breaker. The ground connection 24 is, therefore, incorporated into the circuit interrupter 2 for the LED 20 of the indicator circuit 14 to function properly.

EXAMPLE 17

Figure 4:
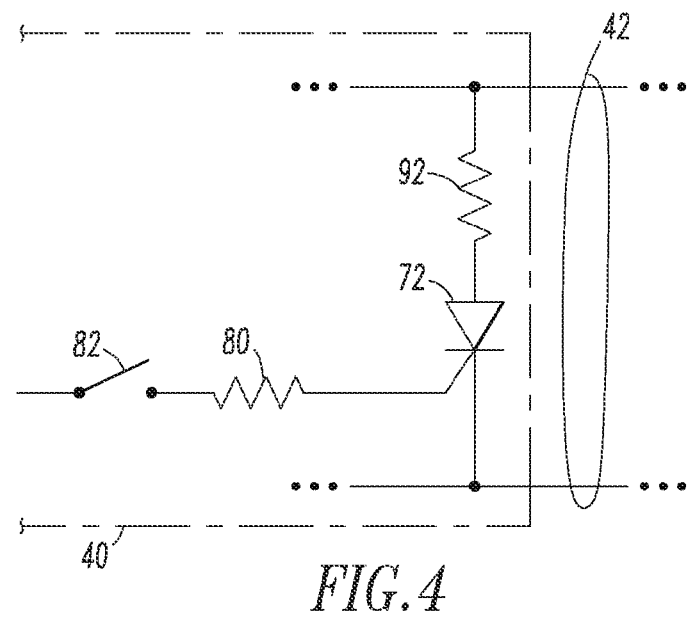
FIG. 4 is a block diagram in schematic form of a shorting circuit including a current limiting resistor in accordance with another embodiment of the disclosed concept.

As shown in FIG. 4, an optional current limiting resistor 92 can be employed on the hot line side of the SCR 72 of FIG. 2. The resistor 92 is electrically connected in series with the SCR 72 between the hot line and the neutral of the power circuit 28 (FIG. 2).

EXAMPLE 18

Figure 5:
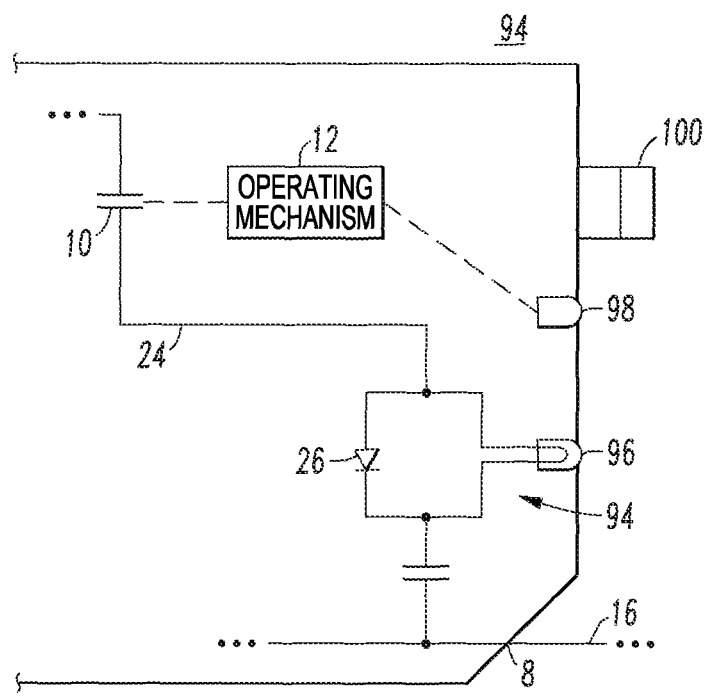
FIG. 5 is a block diagram in schematic form of an indicator circuit of a circuit interrupter including two light emitting diodes (LEDs) in accordance with another embodiment of the disclosed concept.

FIG. 5 shows another indicator circuit 94 that can be used in place of the indicator circuit 14 of FIGS. 1 and 2. The indicator circuit 94 includes a first indicator device, such as an LED 96, to indicate the signal 16 at the second terminal 8 and a second indicator device, such as an LED 98, which is conventional, to indicate when the separable contacts 10 are opened. Otherwise, the circuit interrupter 2 of FIGS. 1 and 2 indicates the open and/or the tripped open positions of the operating mechanism 12 by the position of operating handle 100, as is conventional.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:
1. A circuit interrupter comprising:
an enclosure;
a first terminal;
a second terminal;

separable contacts electrically connected between said first and second terminals;

an operating mechanism structured to open and close said separable contacts; and an indicator circuit electrically interconnected with said second terminal and being structured to indicate occurrence of a signal at said second terminal, wherein said signal has a frequency substantially greater than a power line frequency, and wherein said indicator circuit comprises an inductor electrically connected between said separable contacts and one of said first terminal and said second terminal, an indicator device, and a capacitor electrically connected between said second terminal and the indicator device; wherein the inductor is structured to pass said power line frequency and block the frequency of said signal; and wherein the capacitor is structured to block said power line frequency and pass the frequency of said signal to the indicator device.

2. The circuit interrupter of claim 1 wherein said power line frequency is less than or equal to about 400 Hz.

3. The circuit interrupter of claim 1 wherein the frequency of said signal is about 8 MHz.

4. The circuit interrupter of claim 1 wherein said indicator device is a light emitting diode.

5. The circuit interrupter of claim 1 wherein said indicator circuit comprises a ground connection structured to be electrically connected to a grounded circuit interrupter panel.

6. The circuit interrupter of claim 1 wherein said power line frequency is about 60 Hz; and wherein a voltage applied to said first terminal is about 120 $VAC_{RMS}$.

7. The circuit interrupter of claim 1 wherein a current flowing between said first and second terminals is less than or equal to about 20 $A_{RMS}$ when said separable contacts are closed.

8. The circuit interrupter of claim 1 wherein said indicator device is a first indicator device structured to indicate said signal at said second terminal, and wherein said indicator circuit further comprises a second indicator device structured to indicate when said separable contacts are opened.

9. The circuit interrupter of claim 1 wherein said circuit interrupter is a circuit breaker.

10. The circuit interrupter of claim 1 wherein said indicator device is structured to indicate the occurrence of said signal at said second terminal when said separable contacts are opened or closed.

11. The circuit interrupter of claim 1 wherein said indicator circuit comprises a ground connection.

12. The circuit interrupter of claim 11 wherein said enclosure comprises a mechanical connection point structured to retain said circuit interrupter in a circuit interrupter panel with a number of other circuit interrupters; and wherein said mechanical connection point provides the ground connection to the indicator circuit.

13. The circuit interrupter of claim 1 wherein said power line frequency is about 50 Hz or 60 Hz.

14. A circuit interrupter comprising:
an enclosure;
a first terminal;
a second terminal;
separable contacts electrically connected between said first and second terminals;
an operating mechanism structured to open and close said separable contacts; and
an indicator circuit electrically interconnected with said second terminal and being structured to indicate occurrence of a signal at said second terminal,
wherein said signal has a frequency substantially greater than a power line frequency,
wherein said indicator circuit comprises a capacitor, an indicator device and a diode,
wherein said diode includes an anode and a cathode; wherein said indicator device is a light emitting diode including an anode and a cathode; wherein said capacitor is electrically connected between said second terminal and the anode of said light emitting diode; wherein the cathode of said diode is electrically connected to the anode of said light emitting diode; wherein the anode of said diode is electrically connected to the cathode of said light emitting diode; and wherein the cathode of said light emitting diode is grounded.

15. The circuit interrupter of claim 14 wherein said capacitor is structured to pass the frequency of said signal to the anode of said light emitting diode, in order to illuminate said light emitting diode.

16. The circuit interrupter of claim 14 wherein said capacitor is structured to block the power line frequency from the anode of said light emitting diode.

17. The circuit interrupter of claim 14 wherein said diode is structured to pass negative half cycles of the frequency of said signal.

* * * * *